(12) United States Patent
Shim

(10) Patent No.: US 7,659,195 B2
(45) Date of Patent: Feb. 9, 2010

(54) METHOD FOR FORMING METAL LINE OF SEMICONDUCTOR DEVICE

(75) Inventor: Sang Chul Shim, Incheon (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/262,993

(22) Filed: Oct. 31, 2008

(65) Prior Publication Data
US 2009/0170308 A1    Jul. 2, 2009

(30) Foreign Application Priority Data
Dec. 28, 2007    (KR)    ............. 10-2007-0139927

(51) Int. Cl.
*H01L 23/485*    (2006.01)
(52) U.S. Cl. ............... 438/625; 438/637; 438/642; 438/688; 257/E21.577; 257/E21.582
(58) Field of Classification Search .......... 257/E21.577, 257/E21.582; 438/625, 637, 642, 688, FOR. 354
See application file for complete search history.

(56) References Cited

U.S. PATENT DOCUMENTS

| | | | | |
|---|---|---|---|---|
| 4,990,997 A * | 2/1991 | Nishida | .................. | 257/751 |
| 5,281,854 A * | 1/1994 | Wong | ..................... | 257/740 |
| 5,552,341 A * | 9/1996 | Lee | ..................... | 438/643 |
| 5,629,236 A * | 5/1997 | Wada et al. | ............. | 438/607 |
| 5,633,200 A * | 5/1997 | Hu | ..................... | 438/653 |
| 5,641,993 A * | 6/1997 | Yamaha et al. | ........... | 257/765 |
| 6,017,144 A * | 1/2000 | Guo et al. | ............. | 700/121 |
| 6,312,833 B1 * | 11/2001 | Tsuji et al. | ............ | 428/654 |
| 6,316,335 B1 * | 11/2001 | Takamori et al. | ........ | 438/471 |
| 6,555,471 B2 * | 4/2003 | Sandhu et al. | .......... | 438/652 |
| 7,001,840 B1 * | 2/2006 | Tran et al. | ............ | 438/652 |
| 2002/0014701 A1 * | 2/2002 | Cho et al. | ............. | 257/774 |
| 2006/0049524 A1 * | 3/2006 | Lin et al. | ............. | 257/750 |
| 2009/0170308 A1 * | 7/2009 | Shim | ................... | 438/637 |

FOREIGN PATENT DOCUMENTS

| | | | |
|---|---|---|---|
| JP | 01160036 A | * | 6/1989 |
| JP | 05-114599 | | 5/1993 |
| JP | 05-267290 | | 10/1993 |
| KR | 1020010053650 | | 7/2001 |
| KR | 100677990 | | 1/2007 |

* cited by examiner

*Primary Examiner*—George Fourson
(74) *Attorney, Agent, or Firm*—Workman Nydegger

(57) ABSTRACT

A method for forming metal lines of a semiconductor device is disclosed. The metal line forming method includes forming plugs by perforating via-holes in an interlayer dielectric layer formed on a semiconductor substrate and burying a conductive material in the via-holes, sequentially forming at least two metal layers on the interlayer dielectric layer formed with the plugs, the metal layers having a difference in the size of metal grains of each metal layer, etching an uppermost first metal layer of the at least two metal layers using a photoresist pattern formed on the first metal layer as an etching mask using a first etching gas, and etching the partially etched first metal layer using a second etching gas.

19 Claims, 8 Drawing Sheets

METHOD FOR FORMING METAL LINE OF SEMICONDUCTOR DEVICE

CROSS-REFERENCE TO RELATED APPLICATION

This application claims the benefit of the Korean Patent Application No. 10-2007-0139927, filed on Dec. 28, 2007, which is hereby incorporated by reference in its entirety.

BACKGROUND

1. Field of the Invention

Embodiments of the present invention relate to methods for manufacturing a semiconductor device. More particularly, embodiments of the present invention relate to methods for forming metal lines of a semiconductor device.

2. Discussion of the Related Art

With increasing integration and reduction in the size of semiconductor devices, various configurations have emerged that utilize multilayer lines. Accordingly, the ability to accurately form via-holes and metal lines has become increasingly important in the manufacturing process of semiconductor devices.

FIGS. 1A-1D are sectional views illustrating a conventional method for forming the metal lines of a semiconductor device. As shown in FIG. 1A, a first interlayer dielectric layer 20, made of an oxide layer, is formed on a semiconductor substrate 10. Via-holes are perforated in the first interlayer dielectric layer 20 to form tungsten plugs. After the tungsten plugs are formed in the first interlayer dielectric layer 20, an aluminum layer 30 which is used to form metal lines is deposited over the first interlayer dielectric layer 20 by sputtering. In turn, a photoresist pattern 40 which is used in a subsequent process to form the metal lines is formed over the aluminum layer 30.

As shown in FIG. 1B, the aluminum layer 30 is etched using the photoresist pattern 40 as an etching mask, so as to expose the first interlayer dielectric layer 20, which is for example, made of a $SiO_2$ layer. In the etching of the aluminum layer 30, an etching gas wherein $Cl_2$ and $BCl_3$ are mixed in a predetermined ratio is used.

As shown in FIG. 1C, the residual photoresist pattern 40, which remains after the etching of the aluminum layer 30, is removed via an $O_2$ plasma treatment. Thereafter, a second interlayer oxide layer 50, made of an oxide layer such as, for example, a $SiO_2$ layer, is formed on the aluminum layer 30.

As shown in FIG. 1D, the second interlayer dielectric layer 50 is subjected to subsequent processes (not shown), such as formation of via-holes, formation of tungsten plugs, a Chemical-Mechanical-Polishing (CMP) process, formation of upper metal lines and formation of a passivation layer. Thereafter, the second interlayer dielectric layer 50 is subjected to sintering at 400° C.

Aluminum has a melting point of 660° C. and exhibits poor heat resistance. More particularly, when the aluminum layer 30 is exposed to temperatures above 400° C. while in contact with an oxide layer, such as the second interlayer dielectric layer 50, which is made of a material having a large difference in thermal expansion coefficient with aluminum, an excessively high stress is applied to a contact region between the aluminum layer 30 and the second interlayer dielectric layer 50, and aluminum will flow to alleviate the stress.

When the aluminum layer 30 is exposed to heat during a subsequent thermal treatment, the aluminum flows upwardly and laterally, applying pressure on the second interlayer dielectric layer 50. The stress is concentrated on an upper edge 70 of the aluminum layer 30, causing hillocks on the top of the aluminum layer 30 or cracks 60 in the second interlayer dielectric layer 50.

When the cracks 60 occur in the second interlayer dielectric layer 50, metal grains move through the cracks 60, causing shorts and deteriorating the Electro-Migration (EM) reliability of metal lines.

FIG. 2 illustrates cracks caused in a dielectric layer above the metal lines of a semiconductor device, which are measured using a Scanning Electron Microscope (SEM). Referring to FIG. 2, when a line width of metal lines 3 (for example, aluminum lines) is more than 10 μm, stress is concentrated on an upper edge of a sidewall of the metal line and thus, there is a high probability of cracks in a dielectric layer 7 above the metal lines 3.

SUMMARY OF SOME EXAMPLE EMBODIMENTS

Accordingly, embodiments of the present invention are directed to methods for forming metal lines of a semiconductor device that substantially obviates one or more problems due to limitations and disadvantages of the related art.

In disclosed embodiments of the present invention, methods for forming metal lines of a semiconductor device, which can prevent cracks from forming in an interlayer dielectric layer due to a difference in thermal expansion coefficient between metal lines and the interlayer dielectric layer formed over the metal lines, are disclosed.

For example, one embodiment of the invention is directed a method for forming a plurality of metal lines of a semiconductor device. The method comprises forming plugs by perforating via-holes in an interlayer dielectric layer formed on a semiconductor substrate and burying a conductive material in the via-holes, sequentially forming at least two metal layers on the interlayer dielectric layer formed with the plugs, wherein the metal layers have a difference in the size of metal grains, and etching an uppermost first metal layer of the at least two metal layers using a photoresist pattern formed on the first metal layer as an etching mask using a first etching gas and subsequently etching the partially etched first metal layer using a second etching gas.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF SOME EXAMPLE EMBODIMENTS

Figure 1A:
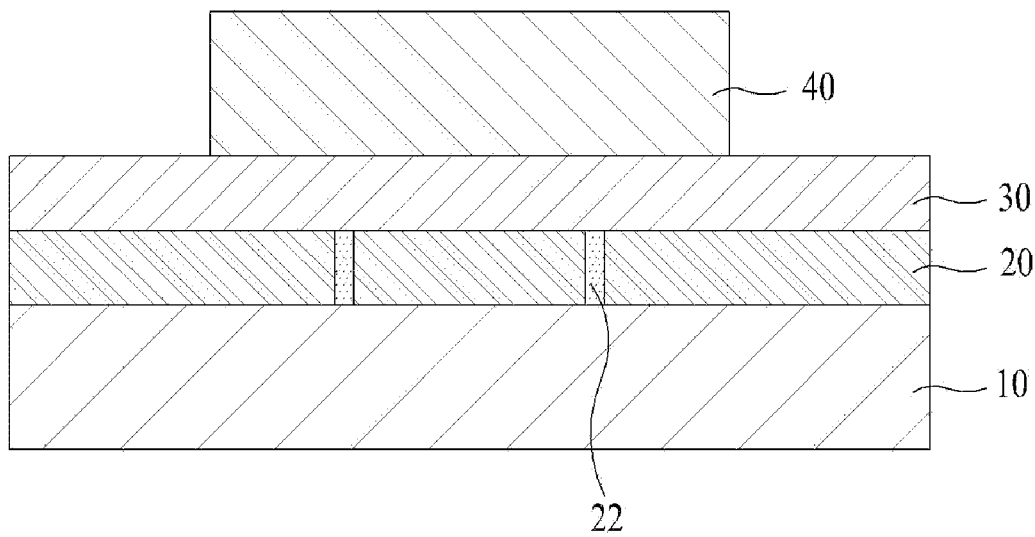
FIGS. 1A-1D are sectional views illustrating a conventional method for forming metal lines of a semiconductor device.
Figure 1B:
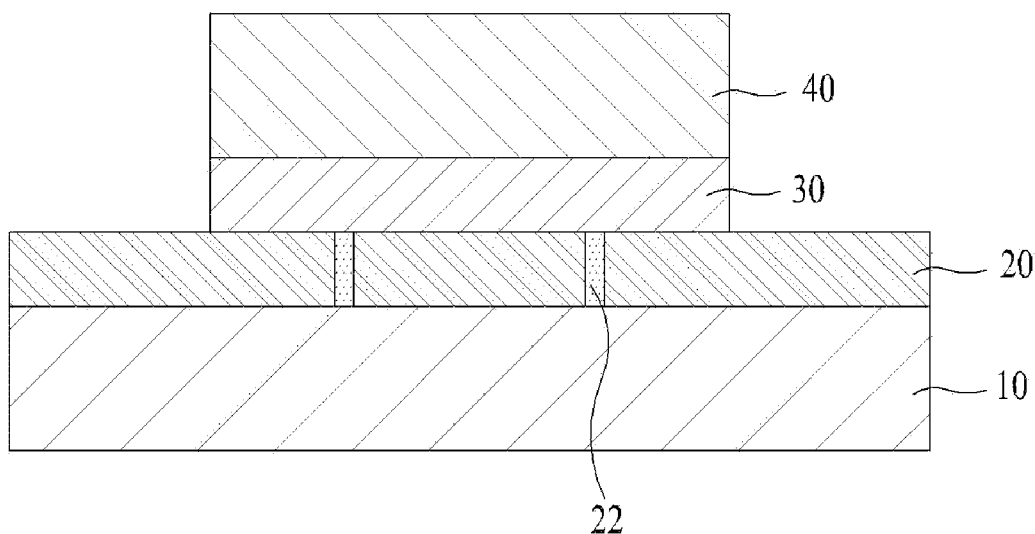
Figure 1C:
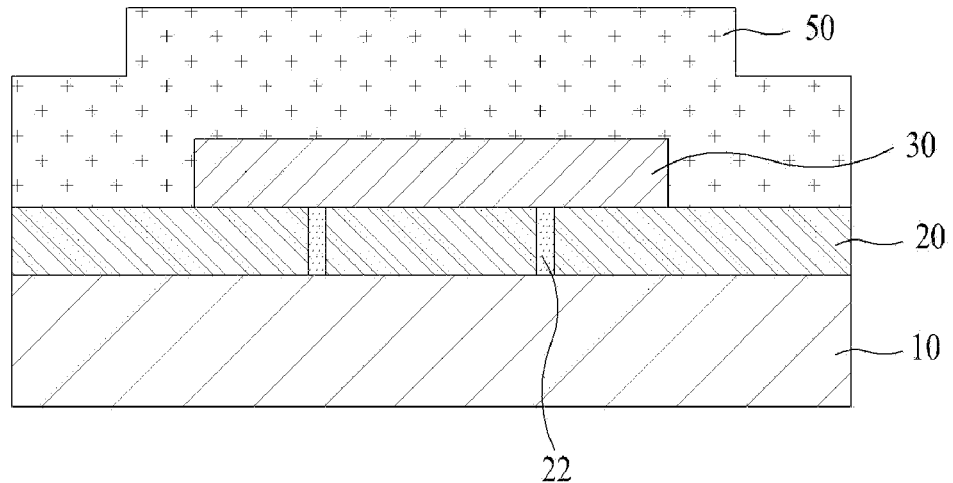
Figure 1D:
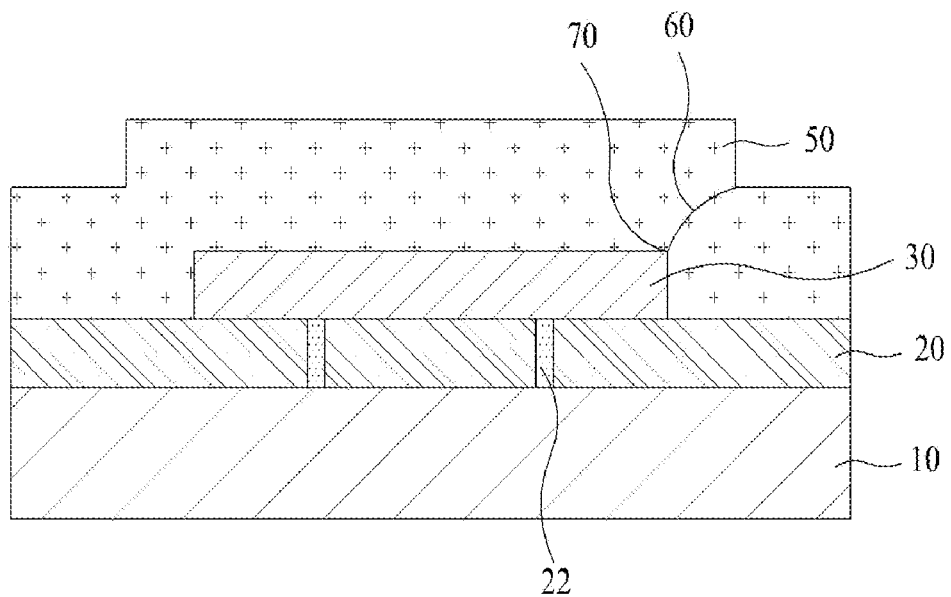
Figure 2:
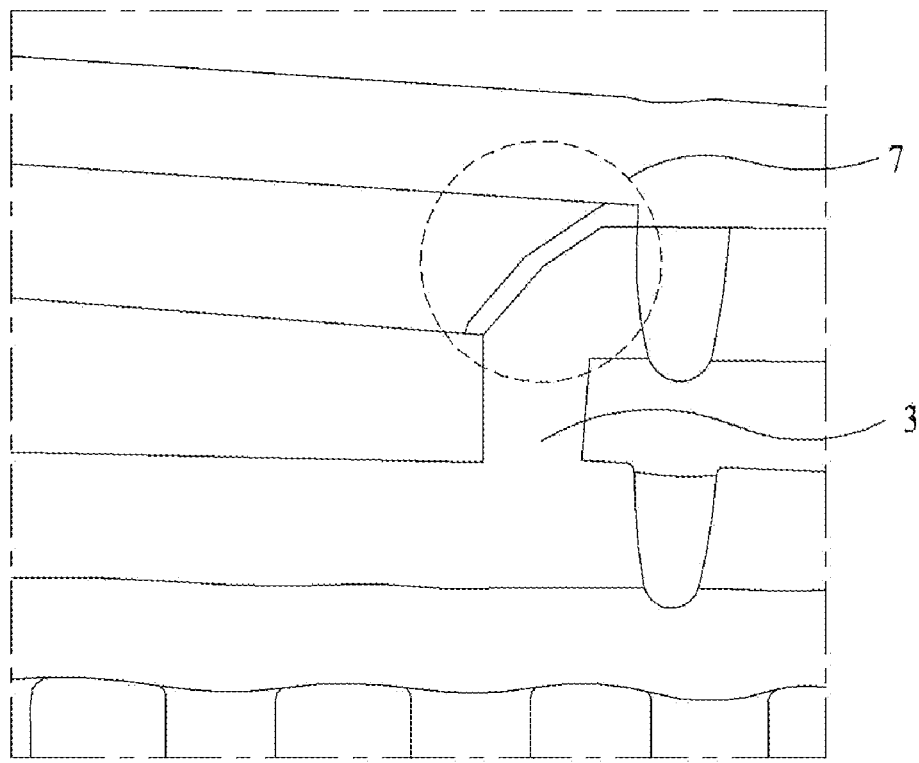
FIG. 2 is a view illustrating cracks caused in a dielectric layer above the metal lines of a semiconductor device as measured by a SEM.

In the following detailed description of the embodiments, reference is made to the accompanying drawings that show, by way of illustration, specific embodiments of the invention. In the drawings, like numerals describe substantially similar components throughout the several views. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

FIGS. 3A-3E are sectional views illustrating a method for forming metal lines according to an example embodiment of the present invention.

Figure 3A:
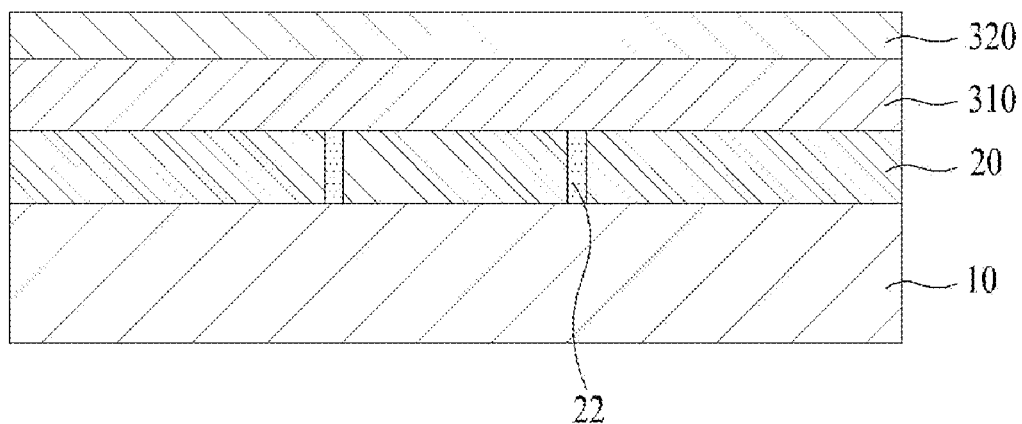
FIGS. 3A-3E are sectional views illustrating a method for forming metal lines according to an embodiment of the present invention.

As shown in FIG. 3A, a first interlayer dielectric layer 20, comprising an oxide layer, is formed on a semiconductor substrate 10 having a lower pattern (not shown). After perforating via-holes in the first interlayer dielectric layer 20, plugs 22 are formed. For example, tungsten plugs 22 can be formed by burying tungsten in the via-holes.

An aluminum layer is deposited over the first interlayer dielectric layer 20 by performing a sputtering process. Specifically, a lower first aluminum layer 310 and an upper second aluminum layer 320 are deposited in two steps.

In this case, note that metal grains of the upper second aluminum layer 320 may be larger than those of the lower first aluminum layer 310. The first aluminum layer 310 and the second aluminum layer 320 can achieve a difference in size of metal grains by changing a deposition wattage required to deposit the aluminum layers 310 and 320.

In addition, the first aluminum layer 310 and the second aluminum layer 320 can have a difference in size of metal grains by changing the deposition temperature. Deposition of the first and second aluminum layers 310 and 320 can be performed under a vacuum state within the same system.

When the size of the grains between the second aluminum layer and the first aluminum layer are changed using the change in deposition wattage method described above, the deposition must be performed in the same chamber. Also, when the size of the grains is modified by changing the deposition temperature as described above, two or more aluminum deposition chambers must be provided within an aluminum deposition system.

In the case of sputtering deposition, the first aluminum layer 310 and the second aluminum layer 320 can also achieve have different sized metal grains by changing the pressure of argon gas.

Figure 3B:
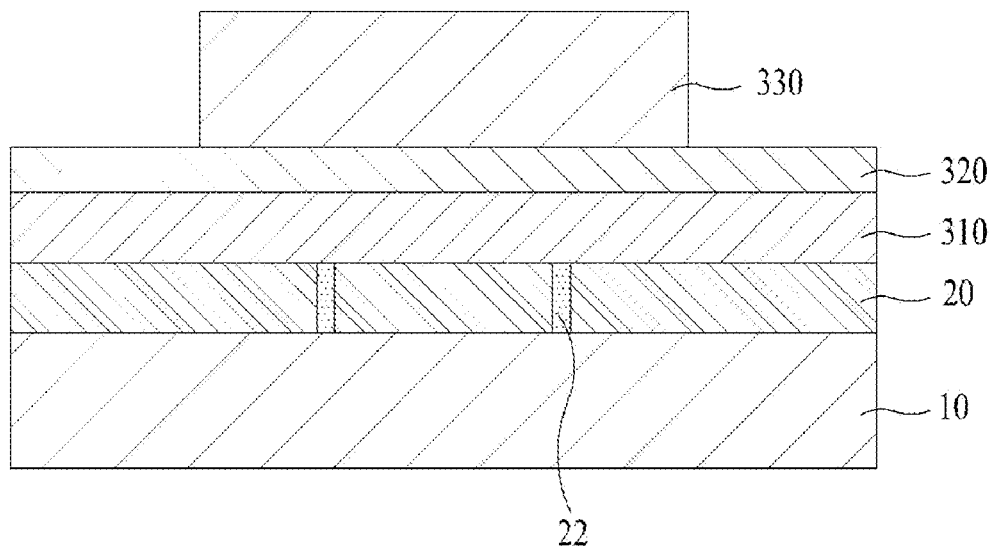

As shown in FIG. 3B, a photoresist pattern 330 which is used as an etching mask of the first and second aluminum layers 310 and 320 is formed.

Figure 3C:
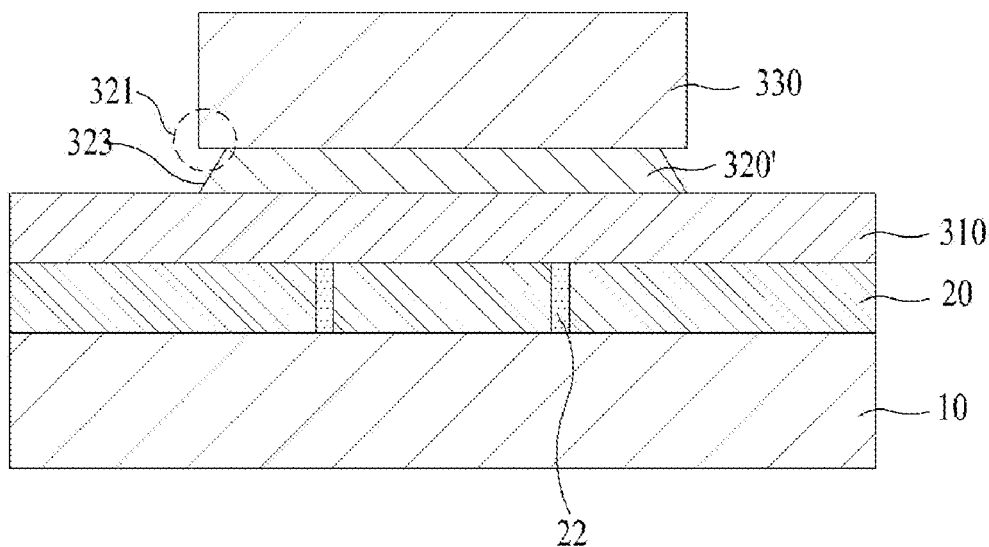

As shown in FIG. 3C, the second aluminum layer 320 is etched using the photoresist pattern 330 as an etching mask.

The second aluminum layer 320 is etched using a first etching gas wherein $Cl_2$ and $BCl_3$ are mixed in a predetermined ratio until less than about 20% of the entire thickness of the second aluminum layer 310 is etched. Then, the residual second aluminum layer 320 is additionally etched using a second etching gas wherein $N_2$ and $CHF_3$ are added to $Cl_2$ and $BCL_3$ to a range of less than about 10% of the flow rate of the second etching gas.

For example, the content of the $N_2$ and $CHF_3$ in the second etching gas can be adjusted to a range of approximately 1~10% of the flow rate of the second etching gas.

The etching of the aluminum layers 310 and 320 is performed at a temperature of less than about 100° C., a pressure of approximately 5~20 mTorr and at an RF wattage of approximately 500~1,000 watts. More preferably, the etching of the aluminum layers 310 and 320 is performed at a temperature of approximately 20~70° C., a pressure of approximately 6~15 mTorr and at an RF wattage of approximately 600~1,000 watt.

The etching using the first etching gas consisting of only $Cl_2$ and $BCL_3$ etches a lower surface 321 of the photoresist pattern 330. In particular, the grains of the second aluminum layer 320 have a relatively small size and thus, the second aluminum layer 320 is etched faster. The second etching gas wherein $N_2$ and $CHF_3$ are added to the first etching gas obliquely etches a sidewall 323 of an etched second aluminum layer 320'.

The oblique sidewall of the etched second aluminum layer 320' can disperse the stress due to a difference in thermal expansion coefficient between the interlayer dielectric layer 20 and the second aluminum layer 320' during the subsequent high-temperature thermal treatment (not shown) This reduces stress applied to the interlayer dielectric layer 20, preventing the occurrence of cracks in the interlayer dielectric layer 20.

Figure 3D:
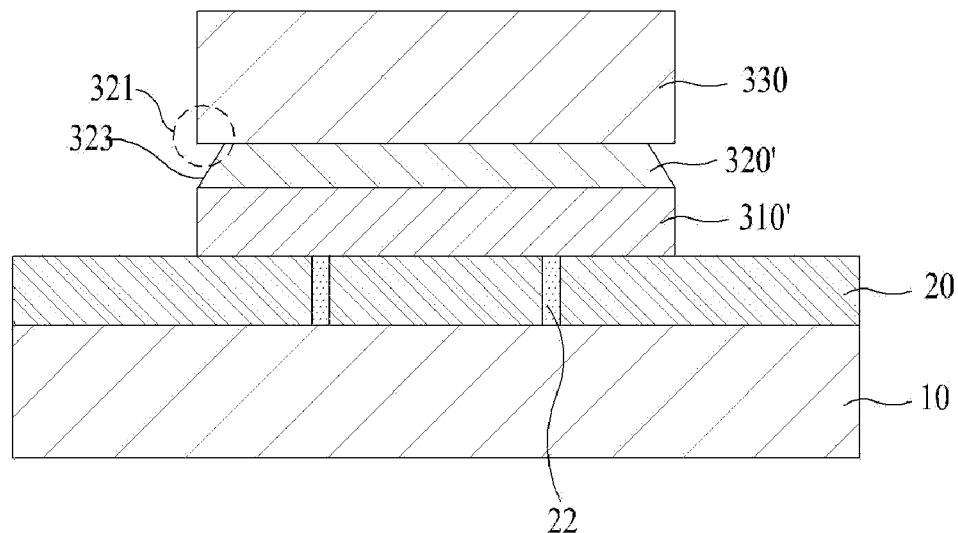

Referring to FIG. 3D, after completing the etching of the second aluminum layer 320', the first aluminum layer 310 is etched using an etching gas wherein $Cl_2$ and $BCl_3$ are mixed in a predetermined ratio. To obliquely etch a sidewall of the first aluminum layer 310, $N_2$ and $CHF_3$ gases may be added to the first etching gas to a range of less than 10% of the flow rate of the resulting etching gas.

Figure 3E:
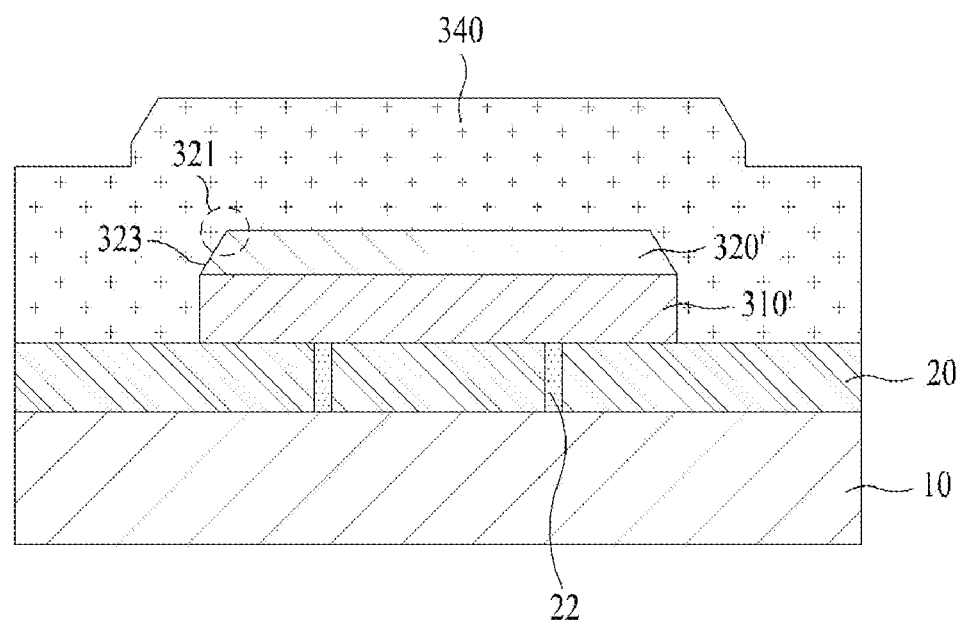

Referring to FIG. 3E, after removing the residual photoresist pattern 330 using $O_2$ plasma treatment, a second interlayer dielectric layer 340, made of an oxide layer, is formed over the etched aluminum layers 310' and 320'.

After performing subsequent processes (not shown) such as formation of via-holes and tungsten plugs, CMP process, formation of upper metal lines, and formation of a passivation layer on the second interlayer dielectric layer 340, the second interlayer dielectric layer 340 is subjected to sintering at about 400° C.

FIGS. 4A-4F are sectional views illustrating sequential processes for forming metal lines according to another example embodiment of the present invention.

Figure 4A:
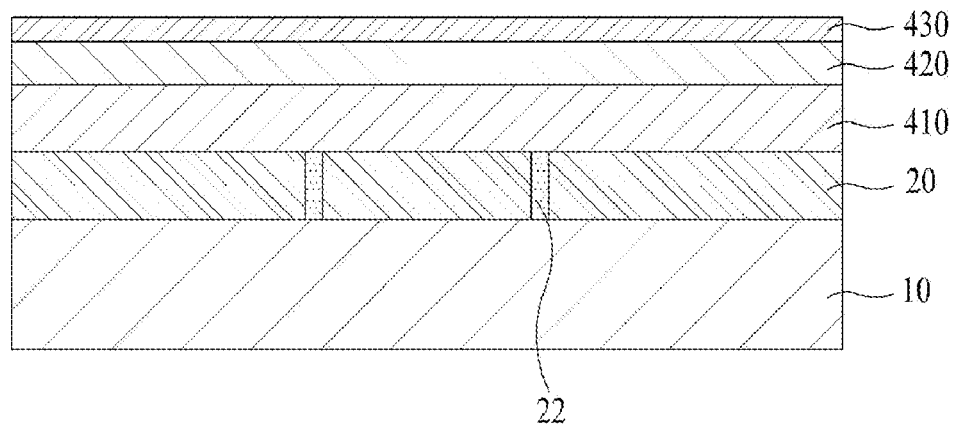
FIGS. 4A-4F are sectional views illustrating additional methods for forming metal lines according to another embodiment of the present invention.

Referring to FIG. 4A, a first interlayer dielectric layer 20 made of an oxide layer, is formed on a semiconductor substrate 10 having a lower pattern (not shown). After perforating via-holes in the first interlayer dielectric layer 20 at selected positions, tungsten is buried in the via-holes and subsequent processes (not shown) including a CMP process are performed to allow the tungsten to remain only in the via-holes.

Aluminum layers 410, 420 and 430, which are used to form metal lines, are deposited over the first interlayer dielectric layer 20 in a sputtering process. Specifically, a lower first aluminum layer 410, an intermediate second aluminum layer 420, and an upper third aluminum layer 430 are deposited in three steps.

Note that metal grains of the first aluminum layer 410 have the largest size, metal grains of the second aluminum layer 420 have the second largest size, and metal grains of the third aluminum layer 430 have the smallest size.

In one example, the aluminum layers 410, 420 and 430 may be formed using the same deposition temperature and pressure of approximately 200~300° C. and approximately 5,000~6,000 mTorr. Also, the first aluminum layer 410, second aluminum layer 420 and third aluminum layer 430 may be sequentially deposited by performing the sputtering process at approximately 10~11 KW, 9.5~10 KW and 9.0~9.5 KW, respectively.

In another example, the aluminum layers 410, 420 and 430 may be formed using the same deposition wattage and pressure of approximately 10~11 KW and approximately 5,000~6,000 mTorr. The first aluminum layer 410, second aluminum layer 420 and third aluminum layer 430 may be deposited by performing the sputtering process at temperatures of approximately 250~300° C., 200~250° C. and 150~200° C., respectively.

The first aluminum layer 410, second aluminum layer 420 and third aluminum layer 430 may be deposited, respectively, in an In-situ manner under a vacuum state within the same system. When the respective aluminum layers have a difference in the size of grains via a change in deposition wattage, the aluminum layers are deposited in the same chamber. However, when the respective aluminum layers have a difference in the size of grains via a change in deposition temperature, three or more aluminum deposition chambers must be provided in an aluminum deposition system.

Figure 4B:
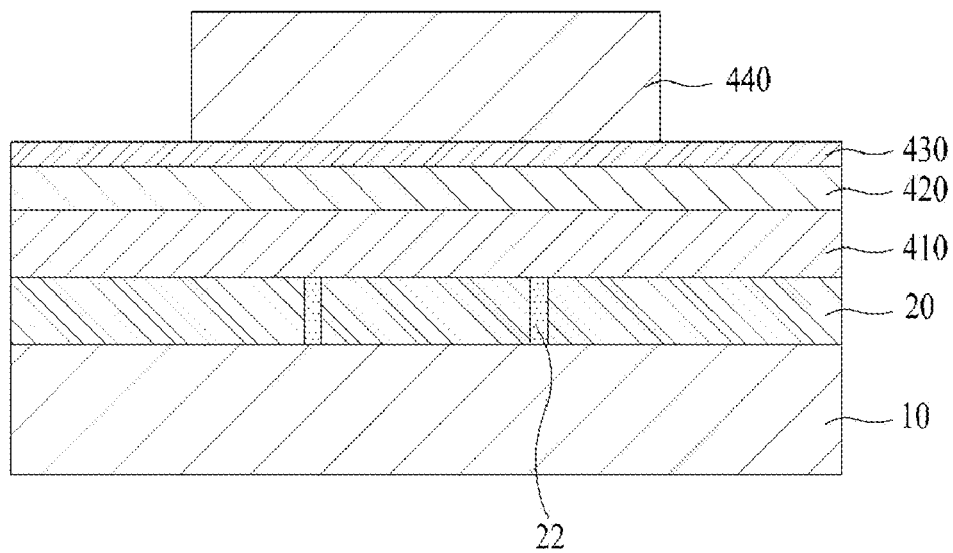

Referring to FIG. 4B, a photoresist pattern 440, which is subsequently used as an etching mask of the aluminum layers 410 to 430, is formed.

Figure 4C:
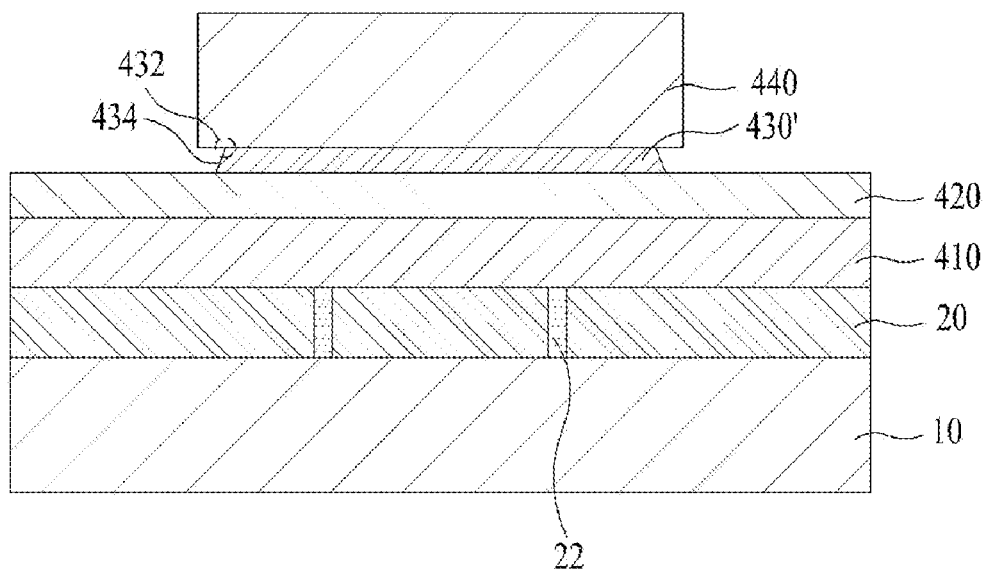

Referring to FIG. 4C, the third aluminum layer 430 is etched using the photoresist pattern 440 as an etching mask. The third aluminum layer 430 is etched using a first etching gas wherein $Cl_2$ and $BCl_3$ are mixed in a predetermined ratio until less than about 20% of the entire thickness of the second aluminum layer 310 is etched. Then, the residual third aluminum layer 430 is additionally etched using a second etching gas wherein $N_2$ and $CHF_3$ are added to $Cl_2$ and $BCl_3$ to a range of less than about 10% of the entire flow rate of the second etching gas.

The etching of the third aluminum layer 430 is performed at a temperature of less than about 100° C., a pressure of approximately 5~20 mTorr and a RF wattage of approximately 500~1,000 watts.

The etching using the first etching gas consisting of only $Cl_2$ and $BCL_3$ etches a lower surface 432 of the photoresist pattern 440. In particular, the grains of the third aluminum layer 430 have a relatively small size and thus, the third aluminum layer 430 is etched relatively quickly. The second etching gas wherein $N_2$ and $CHF_3$ are added to the first etching gas obliquely etches a sidewall 434 of an etched third aluminum layer 430'.

Figure 4D:
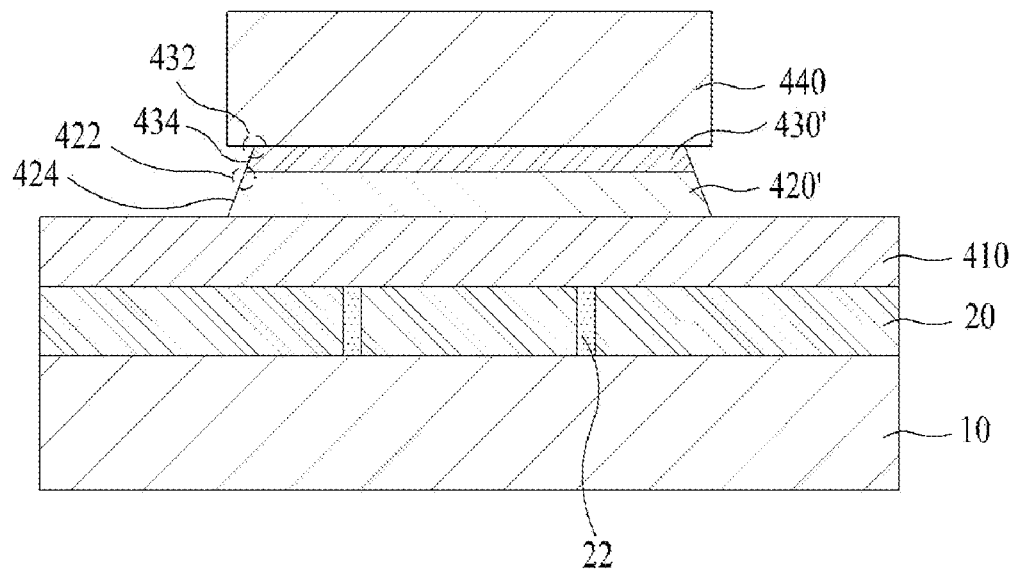

Referring to FIG. 4D, after completing the etching of the third aluminum layer 430', the second aluminum layer 420 is etched using the first etching gas wherein $Cl_2$ and $BCl_3$ are mixed in a predetermined ratio. To obliquely etch a sidewall of the second aluminum layer 420, $N_2$ and $CHF_3$ gases may be added to the first etching gas, such that the second aluminum layer 420 is etched using the resulting second etching gas. In this case, the content of $N_2$ and $CHF_3$ is preferably in a range of less than about 10% of the flow rate of the second etching gas.

Figure 4E:
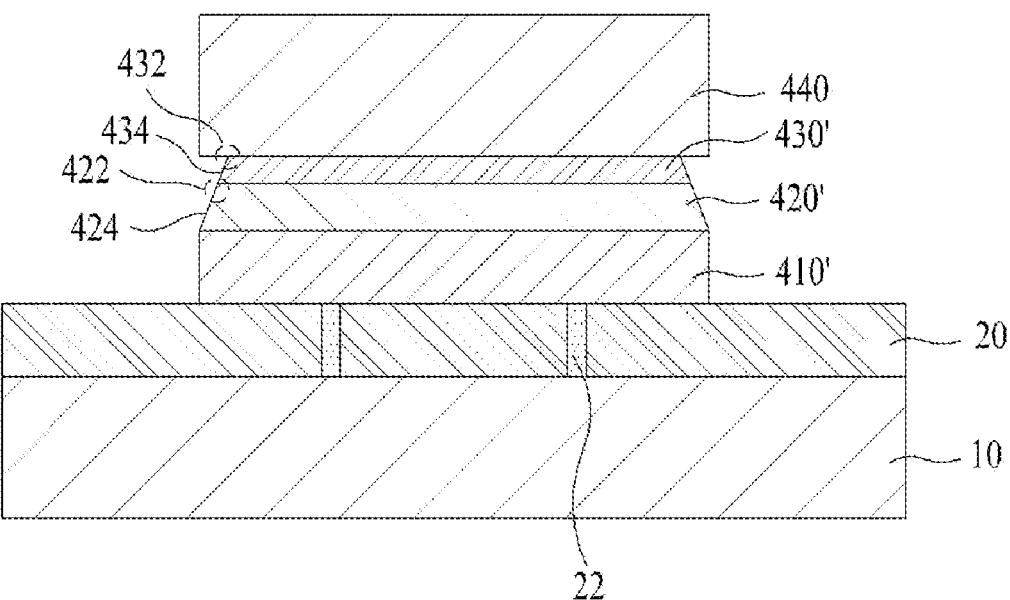

Referring to FIG. 4E, after completing the etching of the second aluminum layer 420', the first aluminum layer 410 is etched. The etching of the first aluminum layer 410 may be performed in the same manner as the etching of the second aluminum layer 420.

Figure 4F:
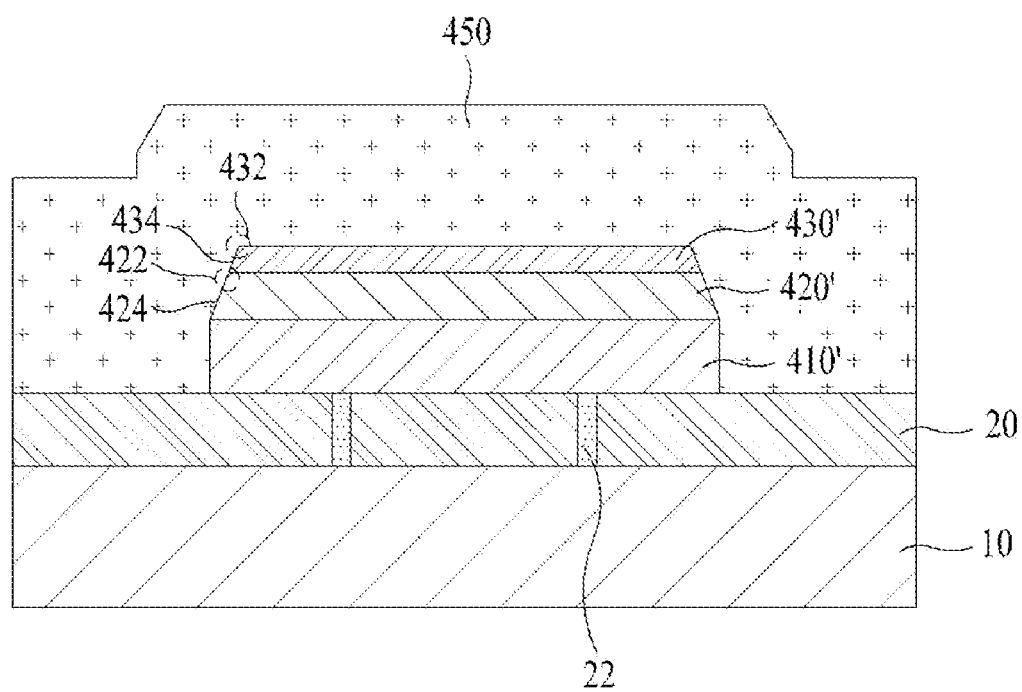

Referring to FIG. 4F, after removing the residual photoresist pattern 440 via $O_2$ plasma treatment, a second interlayer dielectric layer 450, made of an oxide layer, is formed over the etched aluminum layers 410', 420' and 430'. After performing subsequent processes (not shown), such as formation of via-holes and tungsten plugs, CMP process, formation of upper metal lines, and formation of a passivation layer on the second interlayer dielectric layer 450, the second interlayer dielectric layer 450 is subjected to sintering at about 400° C.

As apparent from the above description, by forming the metal lines of a semiconductor device according to the embodiments of the present invention, multiple metal layers to form metal lines are formed, and sidewalls of the metal layers are etched obliquely. The oblique sidewalls have the effect of dispersing stress which is concentrated on an edge of the metal line, thereby preventing cracks due to a difference in thermal expansion coefficient between metal lines and an interlayer dielectric layer formed over the metal lines.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for forming metal lines of a semiconductor device comprising:
    forming plugs by providing via-holes in an interlayer dielectric layer formed on a semiconductor substrate and placing a conductive material in the via-holes;
    sequentially forming at least two metal layers on the interlayer dielectric layer, the metal layers having a difference in the size of metal grains;
    etching an uppermost first metal layer of the at least two metal layers using a photoresist pattern formed on the first metal layer as an etching mask using a first etching gas; and
    etching the partially etched first metal layer using a second etching gas.

2. The method according to claim 1, wherein the metal layers are formed such that the size of the metal grains of the at least two metal layers is gradually reduced at each metal layer such that the uppermost first metal layer has the smallest sized metal grains.

3. The method according to claim 1, wherein the first etching gas comprises a mixture of $Cl_2$ and $BCl_3$.

4. The method according to claim 3, wherein the first etching gas etches the first metal layer to a thickness of less than about 20% of the entire thickness of the first metal layer.

5. The method according to claim 3, wherein the second etching gas is obtained by mixing $N_2$ and $CHF_3$ with the first etching gas.

6. The method according to claim 5, wherein etching the partially etched first metal layer comprises changing the concentration of $N_2$ and $CHF_3$ in the second etching gas.

7. The method according to claim 6, wherein the concentration of $N_2$ and $CHF_3$ in the second etching gas is in a range of approximately 1~10% of the flow rate of the second etching gas.

8. The method according to claim 1, further comprising:
etching a second metal layer below the first metal layer using the first etching gas when the first metal layer is etched.

9. The method according to claim 8, further comprising:
etching the partially etched second metal layer using the second etching gas.

10. The method according to claim 1, further comprising:
removing a residual photoresist pattern using an $O_2$ plasma treatment; and
forming a second interlayer dielectric layer on the etched first metal layer.

11. The method according to claim 1, wherein the at least two metal layers are formed to have metal grains with different sizes by changing the deposition temperature used to form each layer of the at least two metal layers.

12. The method according to claim 1, wherein the at least two metal layers are formed to have metal grains with different sizes by changing the deposition wattage used to form each layer of the at least two metal layers.

13. The method according to claim 1, wherein the at least two metal layers are formed to have metal grains with different sizes by changing the deposition gas pressure used to form each layer of the at least two metal layers.

14. The method according to claim 1, wherein the at least two metal layers comprise aluminum layers.

15. A method for forming metal lines of a semiconductor device comprising:
forming plugs by providing via-holes in an interlayer dielectric layer formed on a semiconductor substrate and providing a conductive material in the via-holes;
sequentially forming at least two metal layers on the interlayer dielectric layer formed with the plugs, the metal layers being formed such that the size of the metal grains of the at least two metal layers is gradually reduced at each metal layer such that an uppermost first metal layer has the smallest sized metal grains;
etching the uppermost first metal layer and a second metal layer below the first metal layer of the at least two metal layers using a photoresist pattern formed on the first metal layer as an etching mask using a first etching gas; and
etching the partially etched first metal layer and second metal layer using a second etching gas.

16. The method according to claim 15, the at least two metal layers are formed to have metal grains with different sizes by changing the deposition temperature used to form each layer of the at least two metal layers.

17. The method according to claim 15, the at least two metal layers are formed to have metal grains with different sizes by changing the deposition wattage used to form each layer of the at least two metal layers.

18. The method according to claim 15, wherein the metal layer forming step sequentially forms the at least two metal layers are formed to have metal grains with different sizes by changing the deposition gas pressure used to form each layer of the at least two metal layers.

19. The method according to claim 15, wherein the at least two metal layers comprise aluminum layers.

* * * * *